June 20, 1967 CARL-ERNST G. NOURNEY 3,327,226

ANTICOINCIDENCE CIRCUIT

Filed Nov. 16, 1964

2 Sheets-Sheet 1

INVENTOR
CARL-ERNST G. NOURNEY

BY Q. C. Smith

ATTORNEY

June 20, 1967 — CARL-ERNST G. NOURNEY — 3,327,226

ANTICOINCIDENCE CIRCUIT

Filed Nov. 16, 1964 — 2 Sheets-Sheet 2

INVENTOR

CARL-ERNST G. NOURNEY

BY Q. C. Smith

ATTORNEY

United States Patent Office 3,327,226

Patented June 20, 1967

3,327,226

ANTICOINCIDENCE CIRCUIT

Carl-Ernst G. Nourney, Palo Alto, Calif., assignor to Hewlett-Packard Company, Palo Alto, Calif., a corporation of California Filed Nov. 16, 1964, Ser. No. 411,459
6 Claims. (Cl. 328—109)

Figure 1:
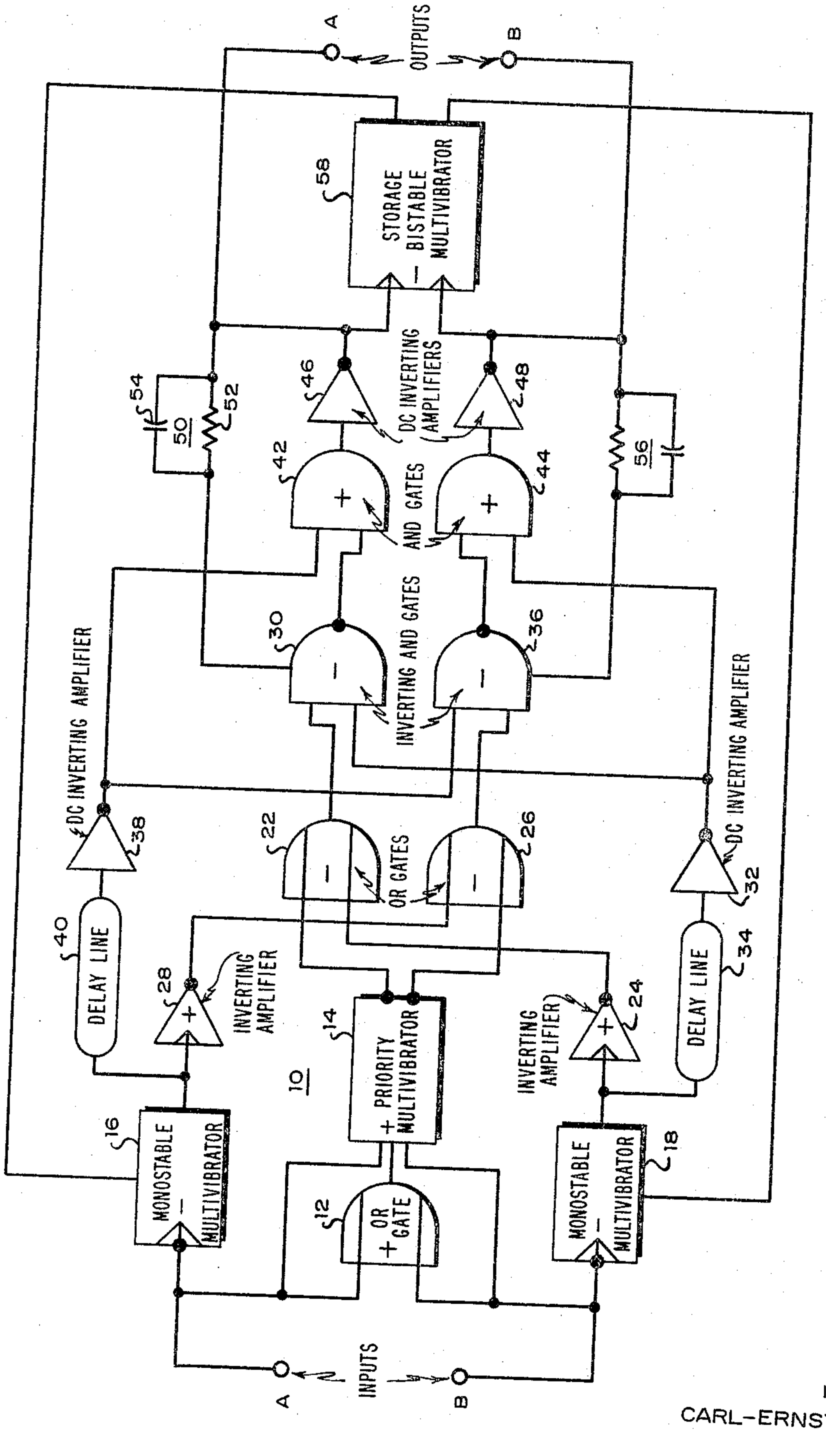

This invention relates to anticoincidence circuits, and particularly to an anticoincidence circuit of the type which provides at least a selected minimum time interval between pulses occurring on different leads.

In asynchronous pulse and digital systems an anticoincidence circuit is often required for processing two independent pulse trains occurring on two different leads, for example two input leads to a pulse counter, to provide at least a selected minimum time interval, $T_1$, between any pulse of one pulse train and an adjacent pulse of the other pulse train. Adjacent pulses occurring on different leads within a time interval which is less than this selected minimum time interval are hereinafter referred to as coincident pulses. A restriction is imposed on the maximum pulse repetition rate of the pulse trains applied to such an anticoincidence circuit, if it is not provided with buffer storage, in that at least a minimum time interval, $T_2$, must be maintained between successive pulses of the same pulse train. The ratio of $2T_1/T_2$ defines a figures of merit, Q, which is useful in rating the performance of such anticoincidence circuits. Ideal performance is achieved when $T_1$ equals $T_2/2$ as indicated by a Q of 1. Conventional anticoincidence circuits of this type typically have a Q ranging from 0.1 to 0.5 for a maximum pulse repetition rate of 100 kc. (one hundred kilocycles per second). However, an improved anticoincidence circuit which has a Q of 0.8 or higher for a maximum pulse repetition rate of at least 1 mc. (one megacycle per second) is required for many applications. For example, a high Q is essential for cascading anticoincidence circuits.

Accordingly, it is principal object of this invention to provide an improved anticoincidence circuit having a higher Q for a higher maximum pulse repetition rate.

A more general object of this invention is to provide an improved anticoincidence circuit for processing two independent pulse trains occurring on two different leads to provide a selected minimum time interval between any pulse of one pulse train and an adjacent pulse of the other pulse train.

In accordance with the illustrated embodiment of this invention there is provided an improved anticoincidence circuit comprising a priority detector connected to receive two independent pulse trains occurring on two different input leads. For each pair of adjacent input pulses, the priority detector generates a pulse at one of its two outputs in response to the first input pulse in time. Similarly, the priority detector generates a pulse at the other output in response to the second input pulse in time, unless the two adjacent input pulses are proximately overlapping in time. Two delay elements, for example monostable multivibrators, are separately connected to a different input lead so that each monostable multivibrator is responsive to the corresponding input pulse for generating a pulse at its output. A dual channel gating circuit is connected to receive the pulse or pulses generated at the outputs of the priority detector and the pulse generated at the output of each monostable multivibrator. The output of each monostable multivibrator is interconnected with both channels of the gating circuit so as to delay transmission of an output pulse along one channel for a selected minimum time interval while an output pulse is passing along the other channel to a corresponding output lead. A storage bistable multivibrator is connected to apply a control signal to each monostable multivibrator in response to the leading edge of this first output pulse. The delay time of each monostable multivibrator is controlled by the control signal applied thereto so as to provide a selected minimum time interval, corresponding to a high Q, between the pair of output pulses.

Figure 4:
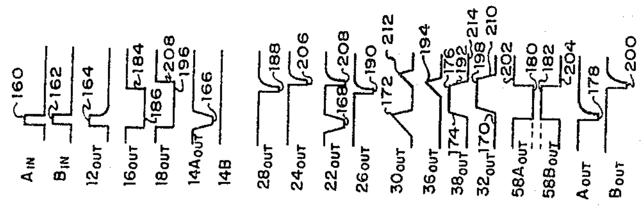
Figure 3:
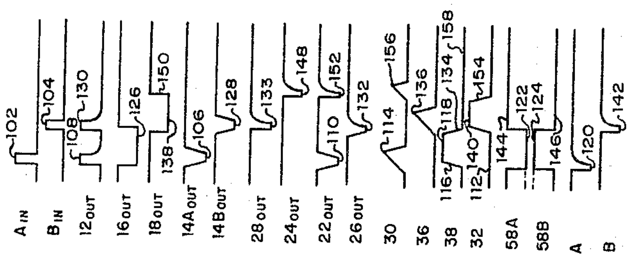
Figure 2:
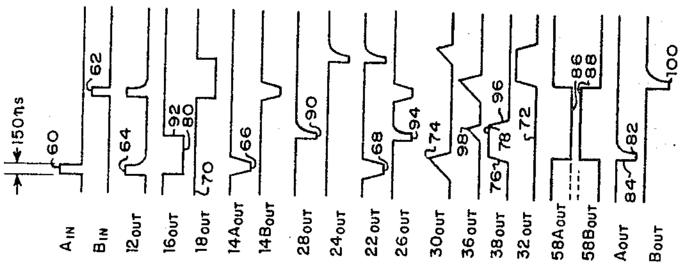

Other and incidental objects of this invention will be apparent from a reading of this specification and an inspection of the accompanying drawing in which:

FIGURE 1 is a block diagram showing an improved anticoincidence circuit according to this invention; and FIGURES 2 through 4 represent in diagram form the relative timings of pulses as they occur at various points in the circuit for different configurations of A and B input pulses.

Referring to FIGURE 1, there is shown a priority detector 10 which is connected to input leads A and B for receiving positive pulses occurring thereon. Priority detector 10 may be constructed as shown in my co-pending patent application Ser. No. 396,845, now Patent No. 3,268,743, filed Sept. 16, 1964, and entitled Pulse Time-Relationship Detector Employing a Multi-State Switching Circuit. Basically, priority detector 10 includes an OR gate 12 which remains disabled unless a positive level is applied to at least one of its two inputs. The polarity sign in each block represents the polarity of signal required to energize the corresponding circuit element for the illustrated embodiment of this invention. Priority detector 10 also includes a priority multivibrator 14 which is constructed like a conventional bistable multivibrator except that it is initially biased for operation in a third discrete operating state during which regeneration is suppressed and both gain elements are either conducting or non-conducting. Input leads A and B are connected to the inputs of OR gate 12, the output of which is connected to the priority multivibrator 14 so that either an A input or a B input positive pulse will restore the regeneration of the priority multivibrator 14 and activate it for operation in one of its two regenerative operating states. The A and B trigger inputs of priority multivibrator 14 are connected directly to input leads A and B, respectively, for receiving positive pulses therefrom. If a positive A input pulse and a positive B input pulse which overlap in time are applied to the priority detector 10, the first pulse is time is applied by OR gate 12 to the priority multivibrator 14 so as to restore the regeneration thereof. Simultaneously, the first pulse in time is also applied to the corresponding trigger input of priority multivibrator 14 so as to set the priority multivibrator for operation in one of its two regenerative states. Once the priority multivibrator 14 has been set for operation in the selected regenerative state, the second pulse in time is ineffective to alter that state. However, at the termination of the second pulse the priority multivibrator is again returned to its third discrete operating state of suppressed regeneration. The priority detector 10 generates a single inverted or negative pulse at one of its A and B outputs (its A output being associated with the A input lead and its B output being associated with the B input lead) for each pair of adjacent positive pulses occurring on input leads A and B, if those pulses are proximately overlapping in time. But if the pair of adjacent positive pulses occurring on input leads A and B are separated by a sufficient time interval to allow for the required settling time of the priority detector 10, it will generate a pair of inverted or negative pulses at its outputs. The large dot symbol shown at the outputs of priority multivibrator 14 is hereinafter used to indicate pulse inversion.

Input leads A and B are A-C coupled to the inputs of variable delay time monostable multivibrators 16 and 18, respectively. The arrowhead symbol shown at the inputs of monostable multivibrators 16 and 18 is hereinafter used to indicate A-C coupling having a time constant considerably shorter than the shortest possible pulse duration. Each of the monostable multivibrators 16 and 18 is responsive to a positive input pulse for generating a negative output pulse because a pulse inversion circuit (not shown but indicated by the large dot symbol) is included at the input of each of the monostable multivibrators 16 and 18 for inverting positive pulses applied thereto. Variable delay time pulse generators 16 and 18 may be constructed as shown in my co-pending patent application Ser. No. 393,535, now Patent No. 3,260,864 filed Sept. 1, 1964, and entitled "Variable Delay Time Pulse Generator." Basically, each of the monostable multivibrators 16 and 18 includes a capacitor the charging time of which determines the delay time of the multivibrator. This capacitor is connected to a source of control signal by a diode which is operative in the conductive state to apply the control signal to the capacitor so as to alter the charge rate thereof and very the delay time of the multivibrator.

A dual channel gating circuit is connected between the outputs of priority multivibrator 14 and output leads A and B. Since each channel of the gating circuit is symmetrical with respect to the other, only one channel is described in detail. The A output of priority multivibrator 14 is connected to one of the two inputs of OR gate 22, which is similar in construction to OR gate 12. The other input of OR gate 22 is connected to the output of an inverting amplifier 24, the input of which is A-C coupled to the output of monostable multivibrator 18. Inverting amplifier 24 is energized only when a positive-going signal is applied thereto. OR gate 22 remains disabled unless a negative level is applied to at least one of its two input terminals. The OR gate 26 on the other channel of the gating circuit, and inverting amplifier 28 are similarly connected. The output of OR gate 22 is connected to one of the two inputs of inverting AND gate 30, the other input of which is connected to the output of D-C inverting amplifier 32. A delay line 34 connects the input of D-C inverting amplifier 32 to the output of monostable multivibrator 18. Inverting AND gate 30 remains disabled unless a negative level is applied to both of its inputs. The inverting AND gate 36 on the other channel of the gating circuit, D-C inverting amplifier 38 and delay line 40 are similarly connected. The output of inverting AND gate 30 is connected to one of the two inputs of AND gate 42, the other input of which is connected to the output of D-C inverting amplifier 38. AND gate 42 remains disabled unless a positive potential with respect to the potential at its output is applied to both of its inputs. The AND gate 44 on the other channel and D-C inverting amplifier 32 are similarly connected. D-C inverting amplifier 46 connects the output of AND gate 42 to output lead A. Similarly, on the other channel D-C inverting amplifier 48 connects the output of AND gate 44 to output lead B. A feedback network 50 comprising parallel connected resistor 52 and capacitor 54 connects the output of D-C inverting amplifier 46 to inverting AND gate 30 so as to provide a latching effect thereon once inverting AND gate 30 has been enabled. Feedback network 56 similarly connects the output of D-C inverting amplifier 48 to inverting AND gate 36 on the other channel.

The outputs of D-C inverting amplifiers 46 and 48 are A-C coupled to the corresponding trigger inputs of a storage bistable multivibrator 58. Storage bistable multivibrator 58 is responsive to a negative-going signal at either of its two trigger inputs for switching to a corresponding one of its two stable operating states. The outputs of storage bistable multivibrator 58 are connected to monostable multivibrators 16 and 18, respectively, so as to supply the control signal required for controlling the delay times thereof and providing a high Q.

The operation of this anticoincidence circuit is best illustrated by considering three distinct cases of A and B input pulse timings. Referring to FIGURE 2, the operation of the anticoincidence circuit is illustrated for the first case in which a positive A input pulse 60 is followed by a positive B input pulse 62 after a time interval substantially greater than the selected minimum time interval. OR gate 12 is responsive to the A input pulse 60 for transmitting a positive pulse 64 to priority multivibrator 14 to restore the regeneration thereof. Simultaneously, the A input pulse 60 is applied to the corresponding trigger input of priority multivibrator 14 thereby setting it for operation in one regenerative operating state for the duration of pulse 64. Negative pulse 66 is generated at the A output of priority multivibrator 14 in response to the A input pulse 60. OR gate 22 is responsive to pulse 66 for transmitting a negative pulse 68 to one input of inverting AND gate 30. D-C inverting amplifier 32 inverts the positive signal 70 at the output of monostable multivibrator 18 so as to apply a negative signal 72 to the other input of inverting AND gate 30. Thus, inverting AND gate 30 is enabled and a positive pulse 74 is applied to one input of AND gate 42. Before the termination of pulse 74 AND gate 42 is enabled by the leading edge 76 of a positive pulse 78 which is applied to the other input of AND gate 42. A negative pulse 80 generated by monostable multivibrator 16 in response to the A input pulse 60 is first delayed by delay line 40 and then inverted by D-C inverting amplifier 38 to provide the positive pulse 78. The delay time of delay line 40 must be less than the time duration of pulse 74 to insure that AND gate 42 will be enabled. D-C inverting amplifier 46 is responsive to the enabled AND gate 42 for applying a negative pulse 82 to the A output lead. A feedback signal supplied by network 50 latches inverting AND gate 30 once it is enabled so as to increase the time duration of output pulse 82. In response to the leading edge 84 of output pulse 82 storage bistable multivibrator 58 is set to a stable state during which a negative signal 86 is applied to monostable multivibrator 16 and a positive signal 88 is applied to monostable multivibrator 18. The delay time of monostable multivibrator 16 and hence the time duration of pulse 80 are determined by the negative signal 86 applied to monostable multivibrator 16. Inverting amplifier 28 generates a negative pulse 90 in response to the trailing edge 92 of pulse 80. OR gate 26 is responsive to pulse 90 for transmitting a negative pulse 94 to one input of inverting AND gate 36. Before the termination of pulse 94 inverting AND gate 36 is enabled by the negative-going trailing edge 96 of pulse 78 which is applied to the other input of inverting AND gate 36. In response to the enabling of inverting AND gate 36 a positive pulse 98 is applied to one input of AND gate 44. However, AND gate 44 is disabled since the negative signal 72 is applied to its other input for the full time duration of pulse 98. Thus, a single pulse 82 is applied to the A output lead in response to the A input pulse 60. Because of the symmetry of this anticoincidence circuit it is apparent that a negative pulse 100 will be similarly applied to the B output lead in response to the B input pulse 62. Since the A and B input pulses 60 and 62 are separated by more than the selected minimum time interval, the overall effect of the anticoincidence circuit is only to delay the transmission of corresponding output pulses 82 and 100 for a time determined by the inherent delays of the various circuit elements and the delay times of delay lines 40 and 34.

Referring to FIGURE 3, the operation of the anticoincidence circuit is illustrated for the second case in which a positive A input pulse 102 is followed by a positive B input pulse 104 after a time interval which is substantially equal to the selected minimum time interval. A negative pulse 106 is generated at the A output of priority multivibrator 14 in response to the coincident application thereto of the positive A input pulse 102 and the positive pulse 108 from OR gate 12. OR gate 22 is responsive to pulse 106 for transmitting a negative pulse 110 to one input of inverting AND gate 30. A negative signal 112 from the output of D-C inverting amplifier 32 is applied to the other input of inverting AND gate 30. Thus inverting AND gate 30 is enabled and a positive pules 114 is applied to one input of AND gate 42. Before the termination of pulse 114 AND gate 42 is enabled by the leading edge 116 of positive pulse 118 which is applied to the other input of AND gate 42 from the output of D-C inverting amplifier 38. D-C inverting amplifier 46 is responsive to the enabled AND gate 42 for applying a negative pulse 120 to the A output lead. The time duration of output pulse 120 is increased because of the feedback signal applied to inverting AND gate 30 by network 50. Storage bistable multivibrator 58 is responsive to the leading edge of negative output pulse 120 for switching to a first stable state during which a negative signal 122 is applied to monostable multivibrator 16 and a positive signal 124 is applied to monostable multivibrator 18. The delay time of monostable multivibrator 16 and hence the time duration of the negative pulse 126 generated thereby are determined by the negative signal 122 applied to monostable multivibrator 16.

A negative pulse 128 is generated at the B output of priority multivibrator 14 in response to the coincident application thereto of the positive B input pulse 104 and the positive pulse 130 from OR gate 12. OR gate 26 is responsive to pulse 128 for transmitting a negative pulse 132 to one input of inverting AND gate 36. The time duration of pulse 132 is increased because of the OR combination of negative pulse 128 and the negative pulse 133 which is generated by inverting amplifier 28 in response to the trailing edge of pulse 126. Before the termination of pulse 132 inverting AND gate 36 is enabled by the negative-going trailing edge 134 of pulse 118 which is applied to the other input of inverting AND gate 36 from the output of D-C inverting amplifier 38. In response to the enabling of inverting AND gate 36 a positive pulse 136 is applied to one input of AND gate 44. A negative pulse 138 generated by monostable multivibrator 18 in response to the B input pulse 104 is first delayed by delay line 34 and then inverted by D-C inverting amplifier 32 to provide a positive pulse 140 at the other input of AND gate 44. Thus, AND gate 44 is enabled and D-C inverting amplifier 48 is energized producing a negative pulse 142 at the B output lead. The time duration of output pulse 142 is increased because of the feedback signal supplied to inverting AND gate 36 by network 56. In response to the leading edge of output pulse 142 storage bistable multivibrator 58 switches to the second stable state during which a positive signal 144 is applied to monostable multivibrator 16 and a negative signal 146 is applied to monostable multivibrator 18. The delay time of monostable multivibrator 18 and hence the time duration of pulse 138 are determined by the negative signal 146 applied to monostable multivibrator 18. Each of the monostable multivibrators 16 and 18 is provided with a first delay time which exceeds the selected minimum time interval by approximately the time delay of delay line 40 or 34 in response to the negative signal applied thereto from storage bistable multivibrator 58 so that the trailing edges of pulses 126 and 138 never coincide. Inverting amplifier 24 generates a negative pulse 148 in response to the trailing edge 150 of pulse 138. OR gate 22 is responsive to pulse 148 for transmitting a negative pulse 152 to one input of inverting AND gate 30. Before the termination of pulse 152 inverting AND gate 30 is enabled by the negative-going trailing edge 154 of pulse 140 which is applied to the other input terminal of inverting AND gate 30. In response to the enabling of inverting AND gate 30 a positive pulse 156 is applied to one input terminal of AND gate 42. However, AND gate 42 is disabled since the negative signal 158 from the output of D-C inverting amplifier 38 is applied to its other input terminal for the full time duration of pulse 156. Since the A and B input pulses 102 and 104 are separated by substantially the selected minimum time interval, the overall effect of the anticoincidence circuit is again only to delay the transmission of corresponding output pulses 120 and 142 for a time determined by the inherent delays of the various circuit elements and the delay times of delay lines 40 and 34.

Referring to FIGURE 4, the operation of the anticoincidence circuit is illustrated for the third case in which a positive A input pulse 160 is followed by a positive B input pulse 162 after a time interval which is so much less than the selected minimum time interval that the pulses 160 and 162 are proximately coincident in time. OR gate 12 is responsive to the OR combination of A input pulse 160 and B input pulse 162 for transmitting a positive pulse 164 to priority multivibrator 14 to restore the regeneration thereof. Simultaneously, the A input pulse 160 is applied to the A trigger input of priority multivibrator 14 thereby setting it for operation in one regenerative operating state for the duration of pulse 164. Setting of the priority multivibrator 14 to the selected regenerative operating state in response to the leading edge of the A input pulse 160, prevents the B input pulse 162 from further triggering the priority multivibrator 14. Thus, a single negative pulse 166 is generated at the A output of priority multivibrator 14 in response to the proximately coincident A and B input pulses 160 and 162. OR gate 22 is responsive to pulse 166 for transmitting a negative pulse 168 to one input of inverting AND gate 30. A negative signal 170 from the output of D-C inverting amplifier 32 is applied to the other input of inverting AND gate 30. Thus, inverting AND gate 30 is enabled and a positive pulse 172 is applied to one input of AND gate 42. Before the termination of pulse 172 AND gate 42 is enabled by the leading edge 174 of positive pulse 176 which is applied to the other input of AND gate 42 from the output of D-C inverting amplifier 38. D-C inverting amplifier 46 is responsive to the enabled AND gate 42 for applying a negative pulse 178 to the A output lead. Storage bistable multivibrator 58 is responsive to the leading edge of output pulse 178 for switching to a first stable state during which a negative signal 180 is applied to monostable multivibrator 16 and a positive signal 182 is applied to monostable multivibrator 18. The negative signal 180 provides monostable multivibrator 16 with a first delay time which exceeds the selected minimum time interval by approximating the time delay of delay line 40.

In response to the trailing edge 184 of the negative pulse 186 generated by monostable multivibrator 16 a negative pulse 188 is generated by inverting amplifier 28. OR gate 26 is responsive to pulse 188 for transmitting a negative pulse 190 to one input of inverting AND gate 36. Before the termination of pulse 190 inverting AND gate 36 is enabled by the negative going trailing edge 192 of pulse 176 which is applied to the other input of inverting AND gate 36 from the output of D-C inverting amplifier 38. In response to the enabling of inverting AND gate 36 a positive pulse 194 is applied to one input of AND gate 44. A negative pulse 196 generated by monostable multivibrator 18 in response to the B input pulse 162 is first delayed by delay line 34 and then inverted by D-C inverting amplifier 32 to provide a positive pulse 198 at the other input of AND gate 44. Thus, AND gate 44 is enabled and D-C inverting amplifier 48 is energized producing a negative pulse 200 at the B output lead. In response to the leading edge of output pulse 200 storage bistable multivibrator 58 switches to the second stable state during which a positive signal 202 is applied to monostable multivibrator 16 and a negative signal 204 is applied to monostable multivibrator 18. However, in response to the positive signal 182 monostable multivibrator 18 is provided with a second delay time which exceeds the first delay time (of monostable multivibrator 16). A negative pulse 206 is generated by inverting amplifier 24 in response to the trailing edge 208 of pulse 196. OR gate 22 is responsive to pulse 206 for transmitting a negative pulse 208 to one input of inverting AND gate 30. Before the termination of pulse 208 inverting AND gate 30 is enabled by the negative-going trailing edge 210 of pulse 198 which is applied to the other input of inverting AND gate 30 from the output of D-C inverting amplifier 32. In response to the enabling of inverting AND gate 30 a positive pulse 212 is applied to one input of AND gate 42. However, AND gate 42 is not enabled since the negative signal 214 from the output of D-C inverting amplifier 38 is applied to its other input for the full time duration of pulse 212. This result is achieved since the second delay time and hence the time duration of pulse 196 is long enough to insure that pulse 206 generated at the output of inverting amplifier 24 does not occur until the termination of pulse 176 generated at the output of D-C inverting amplifier 38. Thus, A and B output pulses 178 and 200 separated by a selected minimum time interval are produced in response to the proximately coincident A and B input pulses 160 and 162. The selected minimum time interval is determined by the first delay time of monostable multivibrator 16 less the inherent delays of the various circuit elements and the delay times of delay lines 40 and 34.

I claim:

1. A device for processing pulses applied at a plurality of input terminals to provide pulses spaced from each other by at least a minimum time interval at corresponding output terminals, said device comprising:

a switch having a plurailty of inputs and a plurality of outputs;

means connecting said input terminals to one of the plurality of inputs of said switch for applying at least one activating signal thereto in response to the pulses applied at the input terminals;

the remaining inputs of said switch being connected to corresponding ones of said input terminals for receiving the pulses applied thereto;

said switch generating a pulse at one of its plurality of outputs in response to said activating signal and one of said pulses applied at the input terminals;

a multi-channel gating circuit connected between said output terminals and the plurality of outputs of said switch for receiving the pulse generated by said switch;

a plurality of pulse delay devices, each of said pulse delay devices being connected to a different one of said input terminals and having a variable delay time in response to a control signal applied thereto;

said pulse delay devices generating signals of controlled duration in response to the pulses applied at the corresponding input terminals;

circuit means connecting each of said pulse delay devices to each channel of said multi-channel gating circuit for applying signals derived from said pulse delay devices to said channels to delay transmission of a pulse along one channel to the corresponding one of said output terminals for at least said minimum time interval after transmission of a pulse along another channel to the corresponding one of said output terminals; and means including a storage device connecting said output terminals to said pulse delay devices;

said storage device being responsive to the pulses applied to said output terminals for generating said control signals to control the delay times of said pulse delay devices and provide said minimum time interval.

2. A device for processing pulses applied at a plurality of input terminals to provide pulses spaced from each other by at least a minimum time interval at corresponding output terminals, said device comprising:

a switch having a plurality of inputs and a plurality of outputs;

said switch having first, second and third discrete operating states during said first of which regeneration is suppressed;

an OR gate connecting said input terminals to one of the plurality of inputs of said switch for at least one activating pulse thereto in response to the pulses applied at the input terminals to restore the regeneration of the switch;

the remaining inputs of said switch being connected to corresponding ones of said input terminals for setting the switch to one of its second and third discrete operating states for the duration of said activating signal in response to one of the pulses applied to the input terminals;

said switch generating a pulse at one of its plurality of outputs in response to said activating signal and one of said pulses applied at the input terminals;

a multi-channel gating circuit connected between said ouptut terminals and the plurality of outputs of said switch for receiving the pulse generated by said switch;

a plurality of pulse delay devices, each of said pulse delay devices being connected to a different one of said input terminals and having a variable delay time in response to a control signal applied thereto;

said pulse delay devices generating signals of controlled duration in response to the pulses applied at the corresponding input terminals;

circuit means connecting each of said pulse delay devices to each channel of said multi-channel gating circuit for applying signals derived from said pulse delay devices to said channels to delay transmission of a pulse along one channel to the corresponding one of said output terminals for at least said minimum time interval after transmission of a pulse along another channel to the corresponding one of said output terminals; and means including a storage device connecting said output terminals to said pulse delay devices;

said storage device being responsive to the pulses applied to said output terminals for generating said control signals to control the delay times of said pulse delay devices and provide said minimum time interval.

3. A device as in claim 2, wherein each of the channels of said multi-channel gating circuit comprises:

an OR gate and first and second AND gates, each of said gates having a plurality of inputs and an output;

one of the inputs of said OR gate being connected to receive a pulse generated at one of the outputs of said switch;

said circuit means including first means responsive to a signal generated by one of said pulse delay devices and connected between said one pulse delay device and another input of said OR gate for applying signal thereto;

one of the inputs of said first AND gate being connected to the output of said OR gate for receiving the signal therefrom when said OR gate is enabled;

said circuit means including second means responsive to a signal generated by said one pulse delay device and connected between said one pulse device and another input of said first AND gate for applying signal thereto;

means connecting the output of said first AND gate and one input of said second AND gate for applying thereto the signal from said first AND gate when said first AND gate is enabled;

said circuit means including third means responsive to a signal generated by another of said pulse delay devices and connected between said other pulse delay device and another input of said second AND gate for applying signal thereto; and means connecting the output of said second AND gate and one of said output terminals for applying a pulse thereto when said second AND gate is enabled.

4. A device as in claim 3 wherein a feedback circuit is connected between said one output terminal and said first AND gate for supplying feedback signal thereto.

5. A device as in claim 1 wherein said circuit means includes means connected between one of said pulse delay devices and said one channel of said multi-channel gating circuit and responsive to the trailing edge of a signal generated by said one pulse delay device for supplying a pulse to said one channel.

6. A device as in claim 3 wherein said first means is responsive to the trailing edge of a signal generated by one of said pulse delay devices for supplying a pulse to said other input of said OR gate.

References Cited

UNITED STATES PATENTS

| | | | |
|---|---|---|---|
| 3,019,350 | 1/1962 | Gauthey | 307—88.5 |
| 3,112,450 | 11/1963 | Krause | 328—109 |
| 3,192,478 | 6/1965 | Metz | 328—44 |

ARTHUR GAUSS, *Primary Examiner.*

S. D. MILLER, *Assistant Examiner.*